(12) United States Patent
Suzuki et al.

(10) Patent No.: US 7,833,865 B2
(45) Date of Patent: Nov. 16, 2010

(54) METHOD OF MANUFACTURING A SEMICONDUCTOR DEVICE INCLUDING A $LaAlO_3$ LAYER

(75) Inventors: Masamichi Suzuki, Kanagawa-Ken (JP); Daisuke Matsushita, Kanagawa-Ken (JP); Takeshi Yamaguchi, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/149,572

(22) Filed: May 5, 2008

(65) Prior Publication Data

US 2008/0318404 A1    Dec. 25, 2008

Related U.S. Application Data

(62) Division of application No. 11/176,271, filed on Jul. 8, 2005, now abandoned.

(30) Foreign Application Priority Data

Sep. 13, 2004    (JP)    ............................. 2004-264828

(51) Int. Cl.
 *H01L 29/788* (2006.01)
(52) U.S. Cl. ...................... 438/287; 438/261; 438/216; 438/591; 257/410
(58) Field of Classification Search ................ 257/410; 438/216, 261, 421, 591, 595, 287
See application file for complete search history.

(56) References Cited

U.S. PATENT DOCUMENTS

| | | | |
|---|---|---|---|
| 6,365,470 B1 | 4/2002 | Maeda | |
| 6,407,435 B1 | 6/2002 | Ma et al. | |
| 6,528,376 B1 * | 3/2003 | Guo | ............................ 438/302 |
| 6,642,131 B2 | 11/2003 | Harada | |
| 6,958,511 B1 * | 10/2005 | Halliyal et al. | ............... 257/314 |
| 7,105,889 B2 * | 9/2006 | Bojarczuk et al. | ............ 257/324 |
| 7,115,959 B2 * | 10/2006 | Andreoni et al. | ............. 257/410 |
| 2002/0089023 A1 | 7/2002 | Yu et al. | |
| 2002/0153579 A1 | 10/2002 | Yamamoto | |

(Continued)

FOREIGN PATENT DOCUMENTS

JP    3-74878    3/1991

(Continued)

OTHER PUBLICATIONS

Notification of Reason for Rejection issued by the Japanese Patent Office on Apr. 1, 2008, for Japanese Patent Application No. 2004-264828, and English-language translation thereof.

(Continued)

*Primary Examiner*—Eugene Lee
(74) *Attorney, Agent, or Firm*—Finnegan, Henderson, Farabow, Garrett & Dunner, L.L.P.

(57) ABSTRACT

A semiconductor device includes a silicon substrate; an insulation layer formed on the silicon substrate, the insulation layer containing an oxide of an element of at least one kind selected from at least Hf, Zr, Ti and Ta; an electrode formed on the insulation layer; and a metal oxide layer containing La and Al, the metal oxide layer being provided at at least one of an interface between the silicon substrate and the insulation layer and an interface between the insulation layer and the electrode.

11 Claims, 7 Drawing Sheets

U.S. PATENT DOCUMENTS

| | | | |
|---|---|---|---|
| 2005/0017304 A1 | 1/2005 | Matsushita et al. | |
| 2005/0224897 A1* | 10/2005 | Chen et al. | 257/410 |
| 2005/0269651 A1* | 12/2005 | Chen et al. | 257/411 |

FOREIGN PATENT DOCUMENTS

| | | |
|---|---|---|
| JP | 2001-189312 | 7/2001 |
| JP | 2002-314072 | 10/2002 |
| JP | 2005-5556 | 1/2005 |
| KR | 2001-0051012 | 6/2001 |
| KR | 2003-0024897 | 3/2003 |
| WO | WO 02/075813 A1 | 9/2002 |

OTHER PUBLICATIONS

Notification of Reason for Rejection issued by the Japanese Patent Office on Oct. 16, 2007, for Japanese Patent Application No. 2004-264828, and English-language translation thereof.

Yan, et al., "High quality, high-$k$ gate dielectric: amorphous LaAlO$_3$ thin films grown on Si(100) without Si interfacial layer", Applied Physics A, vol. 77, pp. 721-724, (Feb. 26, 2003).

Carlson, et al., "Laser-ablated Epitaxial LaAlO$_3$ buffer layers on biaxially textured Ni substrates for superconducting tapes", Physica C, vol. 304, pp. 82-88, (May 22, 1998).

Koike, et al., "Effect of Hf-N Bond on Properties of Thermally Stable Amorphous HfSiON and Applicability of this Material to Sub-50nm Technology Node LSIs", IEDM Tech. Dig., pp. 107-110, (2003).

Patent Office Notification of Argument Submission issued by the Korean Patent Office on Oct. 30, 2006, for Korean Patent Application No. 10-2005-84743, and English-language translation thereof.

* cited by examiner

FIG. 1

FIG. 2A Si 2s SPECTRUM

FIG. 2B La 3d SPECTRUM

FIG. 2C Al 2p SPECTRUM

HfO₂/Si SUBSTRATE STRUCTURE

FIG. 3A

HfO₂/LaAlO/Si SUBSTRATE STRUCTURE

METHOD OF MANUFACTURING A SEMICONDUCTOR DEVICE INCLUDING A LAAlO₃ LAYER

CROSS-REFERENCE TO RELATED APPLICATIONS

This is a divisional application of application Ser. No. 11/176,271, filed Jul. 8, 2005, now abandoned, which is based upon and claims the benefit of priority from prior Japanese Patent Application No. 2004-264828, filed Sep. 13, 2004, the entire contents of both of which are incorporated herein by reference.

BACKGROUND OF THE INVENTION

1. Field of the Invention

The present invention relates to a semiconductor device and its manufacturing method. In particular, the present invention relates to a semiconductor device that includes an insulation layer having a high dielectric constant and its manufacturing method.

2. Background Art

The scale down of CMOS LSIs demand thinner gate insulation layers. Gate insulation layers in the next generation MOS field effect transistors having a size smaller than 0.1 μm are demanded to have equivalent oxide thickness of 1.5 nm or less. In this film thickness region, however, suppression of leakage current caused due to a direct tunnel current cannot be conducted, and $SiO_2$ can no longer be used as a gate insulation layer because of a resultant increase of power dissipation. As a substitute material for it, therefore, a material having a high dielectric constant and a film thickness increased to suppress the leak current, i.e., a high-k material is now being researched and developed vigorously worldwide.

Heretofore, a large number of high-k materials have been proposed. Especially in recent years, for example, a $HfO_2$ layer, a HfSiO layer, or a HfSiON layer obtained by adding N to the HfSiO layer are expected to be promising toward practical use because of not only high dielectric constant but also their thermal stability. Especially, as regards the HfSiON layer, crystallization causing a leak current or impurity diffusion is not caused even after a heat treatment process performed for activation anneal of polycrystalline silicon used as a gate electrode, and an equivalent oxide thickness of 0.6 nm is achieved (see IEDM Tech. Dig. (2003) 107).

In such a structure using a Hf material such as the $HfO_2$, HfSiO or HfSiON layer as the gate insulation layer, a low dielectric constant layer, which is considered to be $SiO_2$ formed by reaction between the gate insulation layer and silicon in the substrate, is formed at an interface between the silicon substrate and the gate insulation layer by heat treatment in a semiconductor device manufacturing process.

Going through the heat treatment in the semiconductor device manufacturing process, silicon in the silicon substrate is diffused in the gate insulation layer and accumulated to the surface of the insulation layer to form silicide and consequently a low dielectric constant layer.

In the generation in which a thinner gate insulation layer having an equivalent oxide thickness of 0.5 nm or less when converted to $SiO_2$ is demanded, presence of such a low dielectric constant layer must be eliminated.

There is not only the problem of presence of the low dielectric constant interface, but also a problem that a ON state threshold voltage at which an MISFET with such a gate insulation layer shifts from its ideal value. This results in a problem that the on-current cannot be ensured in a low power supply voltage state. As for the cause of this threshold shift, it is possible to consider a model in which hafnium is bonded with silicon included in polycrystalline silicon or Si diffused in the substrate at the interface between the polycrystalline silicon electrode and the insulation layer, and the Hf—Si bonding level brings about Fermi level pinning.

These problems of the formation of the low dielectric constant layer and the threshold shift occur not only in the gate insulation layer using the Hf material, but also in a high dielectric constant gate insulation layer using an oxide of Zr, Ti or Ta, which is metal in which silicon in the substrate can be diffused, or metal which can react with polycrystalline silicon serving as the electrode, in the same way.

SUMMARY OF THE INVENTION

The present invention has been achieved in order to solve the problems. An object of the present invention is to provide a semiconductor device, and its manufacturing method, capable of suppressing reaction between the insulation layer component and silicon, suppressing formation of the low dielectric layer on the surface of the insulation layer, and suppressing the threshold voltage shift in a high dielectric constant insulation layer applied to semiconductor devices.

A semiconductor device according to an embodiment of the invention comprises a silicon substrate; an insulation layer formed on the silicon substrate, the insulation layer containing an oxide of an element of at least one kind selected from at least Hf, Zr, Ti and Ta; an electrode formed on the insulation layer; and a metal oxide layer containing La and Al, the metal oxide layer being provided at at least one of an interface between the silicon substrate and the insulation layer and an interface between the insulation layer and the electrode.

A semiconductor device manufacturing method according to an embodiment of the invention comprises forming an insulation layer on a silicon substrate, the insulation layer containing an oxide of an element of at least one kind selected from Hf, Zr, Ti and Ta; forming an electrode on the insulation layer; and forming a metal oxide by using at least one of the following metal oxide forming processes, (a) forming a metal oxide layer containing La and Al on a surface of the silicon substrate before forming the insulation layer; and (b) forming a metal oxide layer containing La and Al on a surface of the insulation layer after forming the insulation layer before forming the electrode.

A semiconductor device manufacturing method according to another embodiment of the invention comprises forming an insulation layer on a silicon substrate, the insulation layer containing an oxide of an element of at least one kind selected from Hf, Zr, Ti and Ta; forming an electrode on the insulation layer; and forming a metal oxide by using at least one of the following metal oxide forming processes, (c) forming a metal layer having metal La and metal Al deposited so as to have a thickness of one atom layer or less on a surface of the silicon substrate, and then depositing a metal oxide layer containing La and Al on the metal layer in an oxidation atmosphere and oxidizing the metal layer, before forming the insulation layer; and (d) forming a metal layer having metal La and metal Al deposited so as to have a thickness of one atom layer or less on a surface of the insulation layer, and then depositing a metal oxide layer containing La and Al on the metal layer in an oxidation atmosphere and oxidizing the metal layer, after forming the insulation layer before forming the electrode.

According to the present embodiments, it is possible to provide a semiconductor device, and its manufacturing method, capable of suppressing reaction between the insulation layer component and silicon, suppressing formation of the low dielectric layer on the surface of the insulation layer, and suppressing the threshold voltage shift in a high dielectric constant insulation layer applied to semiconductor devices.

DETAILED DESCRIPTION OF THE INVENTION

The present inventors have studied energetically in order to solve the problems. Paying attention to the fact that the every problem is caused by reaction conducted between an element forming the insulation layer and silicon forming the silicon substrate or electrode, the present inventors have found that a structure having a barrier layer formed of a material that suppresses the interface reaction at upper and lower interfaces and diffusion of silicon from the substrate is effective. In other words, the present invention provides a structure having, as the barrier layer at at least the upper or lower interface of the high dielectric constant insulation layer, an insulation layer having a dielectric constant that is sufficiently high as compared with $SiO_2$ without causing the silicon diffusion and the silicide formation reaction with silicon, and/or formation of a low dielectric constant interface layer.

Hereafter, the present invention will be described in detail.

First, a result obtained by evaluating characteristics of a metal oxide layer (hereafter referred to as LaAlO layer) containing La and Al formed on a silicon substrate with paying attention to the interface reaction and the silicon diffusion. suppression effect will now be described.

Figure 1:
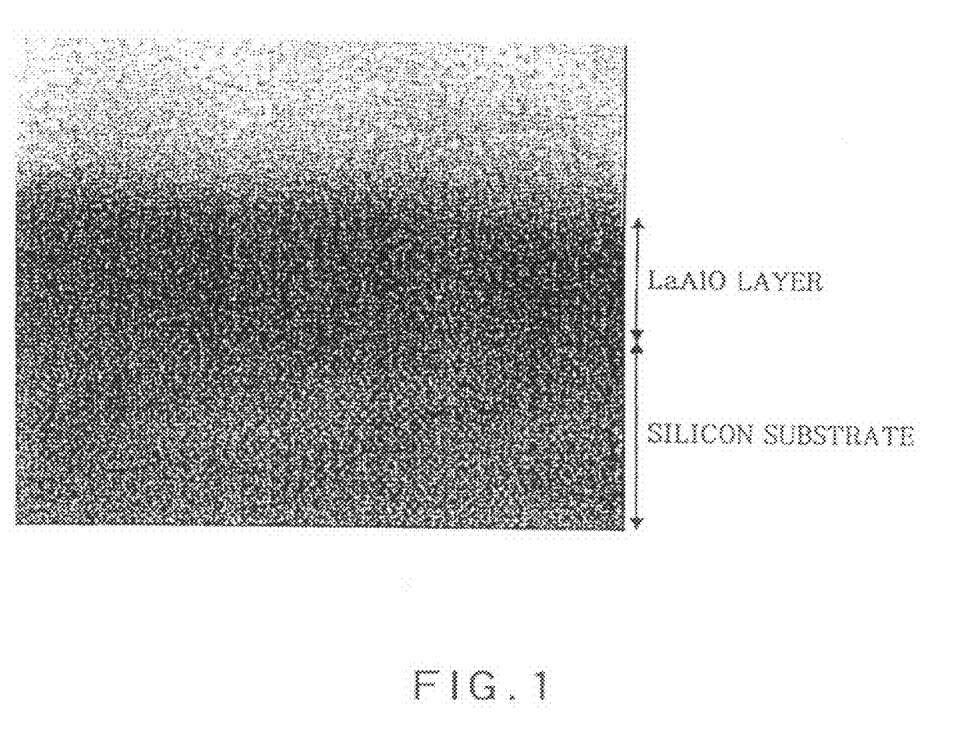
FIG. 1 shows a cross sectional TEM image of the LaAlO layer.

On an n-type silicon substrate with a native oxide film removed by dilute HF solution, a LaAlO layer having a thickness of 5 nm is deposited by using Pulsed Laser Deposition method in which $LaAlO_3$ single crystal substrate is used as a target. A resultant sample is introduced into an RTA (Rapid Thermal Anneal) apparatus, and subjected to RTA processing at 1,000° C. for 30 seconds in a nitrogen atmosphere under the normal pressure. FIG. 1 shows a cross sectional TEM image of the resultant sample. As shown in FIG. 1, the silicon substrate and the LaAlO layer are in direct contact with each other, and any transition layer is not present. The LaAlO layer is an amorphous layer.

Figure 2A:
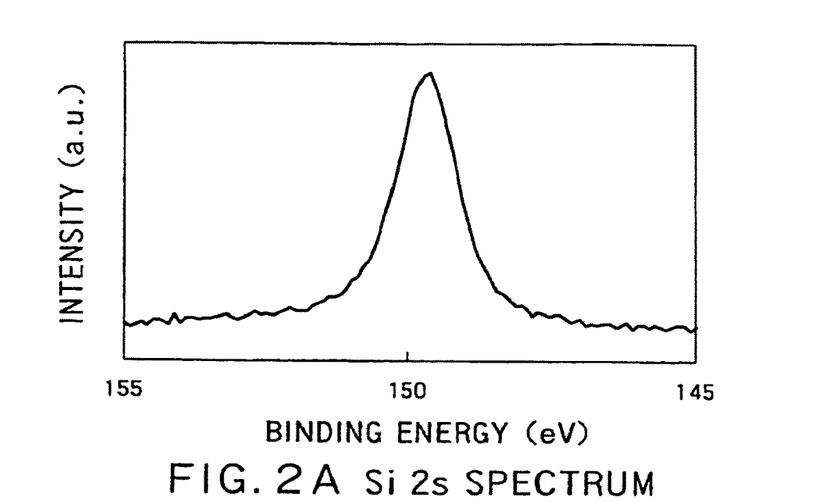
FIGS. 2A to 2C show XPS spectra of the LaAlO layer.
Figure 2B:
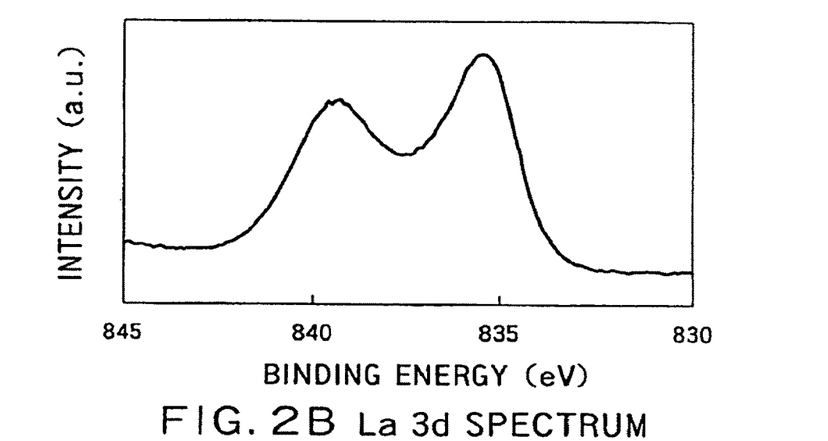
Figure 2C:
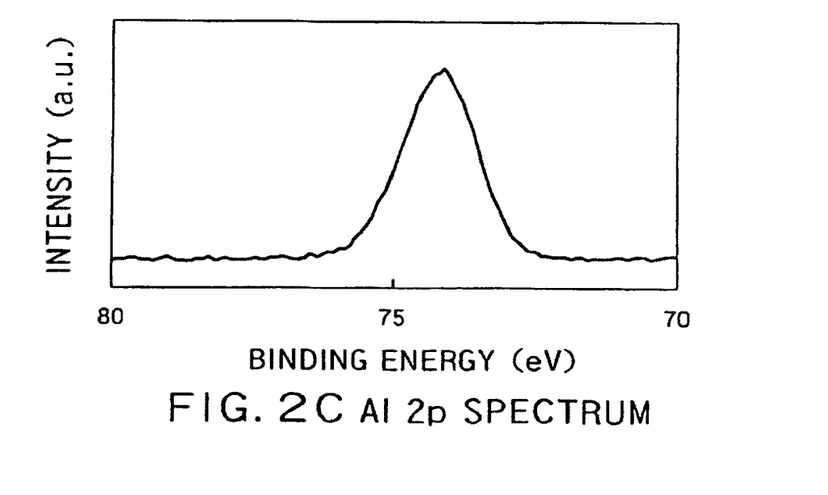

FIGS. 2A to 2C show XPS spectra of Si 2s, La 3d and Al 2p of the LaAlO layer. As for the Si 2s spectrum, a silicon peak is caused by only metal in the Si substrate, and any peak caused by the oxide state is not observed. This result is not contradictory to the result that an interface layer is not observed in the TEM image. In addition, in both the XPS spectra of La 3d and Al 2p as well, only a peak caused by an oxide is observed, and a peak caused by formation of silicide is not observed.

These results show that neither formation of an oxide nor formation of a silicide is caused by reaction of the LaAlO layer with silicon in the substrate even after heat treatment of 1,000° C. is performed.

In the case where the LaAlO layer is formed on a polycrystalline silicon electrode, these results are obtained at an interface between the LaAlO layer and the electrode as well in the same way.

A result obtained by evaluating characteristics of the LaAlO layer in the case where the LaAlO layer is formed at an interface between the silicon substrate and the gate insulation layer of the Hf oxide will now be described.

According to a technique similar to the above-described technique, a LaAlO layer having a thickness of 2 nm is deposited on the silicon substrate and in succession $HfO_2$ is deposited by using Pulsed Laser Deposition method in which $HfO_2$ is used as a target and RTA processing is conducted at 1,000° C. for 30 seconds.

Figure 3A:
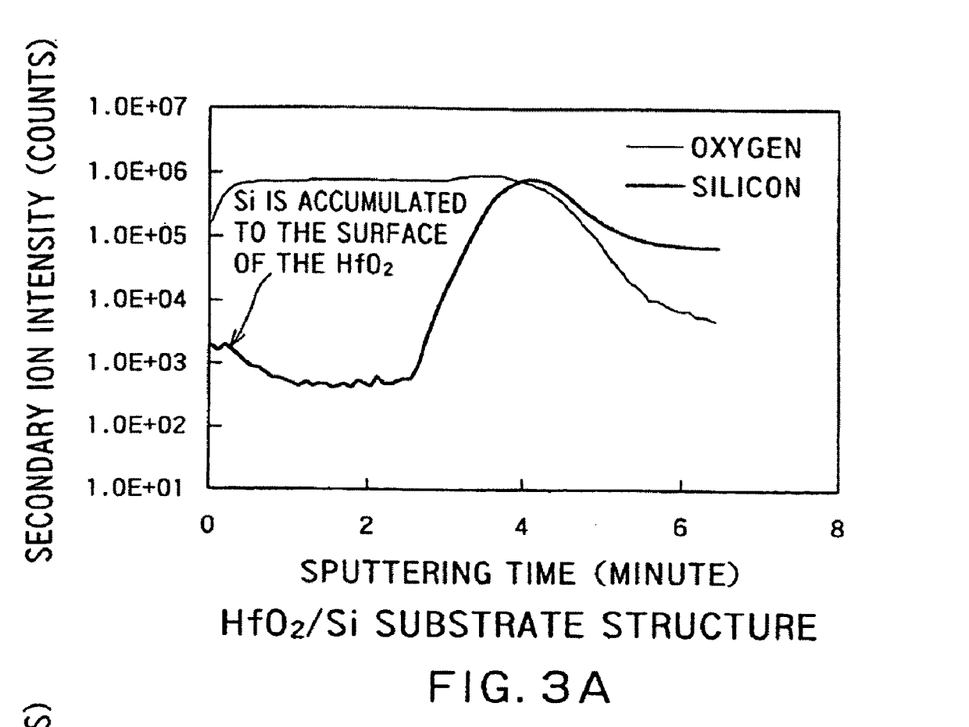
FIGS. 3A and 3B show depth profile of the LaAlO layer and a comparative example by using SIMS.
Figure 3B:
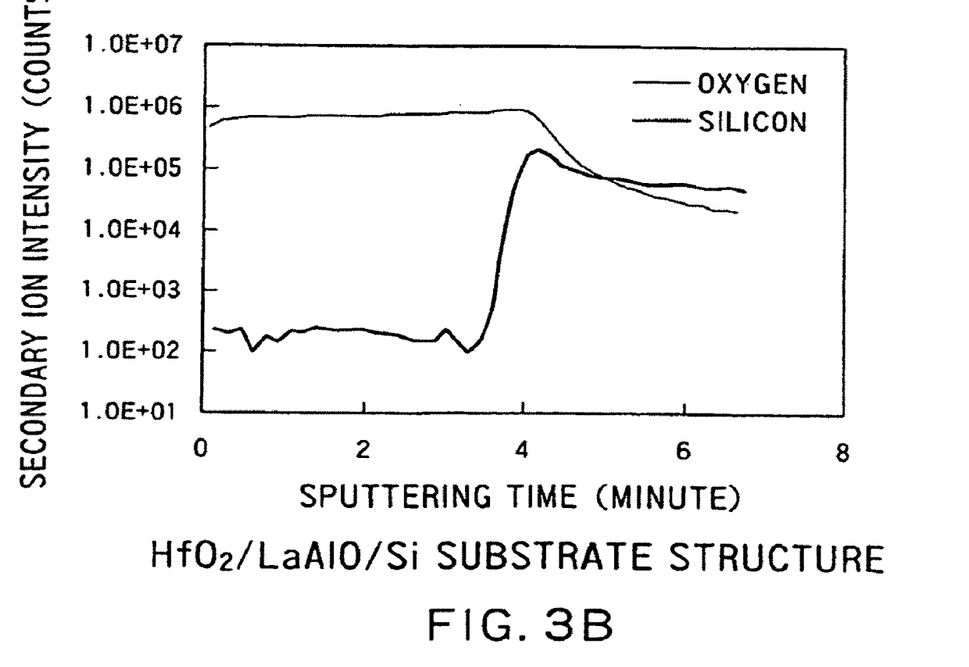

FIG. 3B shows depth profiles of oxygen and silicon of this sample by using the secondary ion mass spectroscopy (SIMS). FIG. 3A shows a result obtained from the same SIMS analysis on an $HfO_2$ single layer film on Si substrate fabricated under the same condition except that the LaAlO layer is not formed, for the purpose of comparison.

In the case where the LaAlO layer is present at the interface between the silicon substrate and the $HfO_2$ layer (FIG. 3B), neither diffusion of silicon from the silicon substrate into the $HfO_2$ layer or the surface nor formation of an interface layer at the interface between the silicon substrate and the LaAlO layer is observed. In the case of the $HfO_2$ single layer film without the LaAlO layer (FIG. 3A), however, it is appreciated that silicon atoms from the silicon substrate is diffused in the layer and accumulated to the surface of the $HfO_2$ layer and an interface layer is formed at an interface between the silicon substrate and the $HfO_2$ layer.

As a result of comparison between FIG. 3A and FIG. 3B, it is shown that the barrier property of the LaAlO layer against the silicon diffusion in the $HfO_2$ layer or formation of the interface layer is tremendous.

Figure 4:
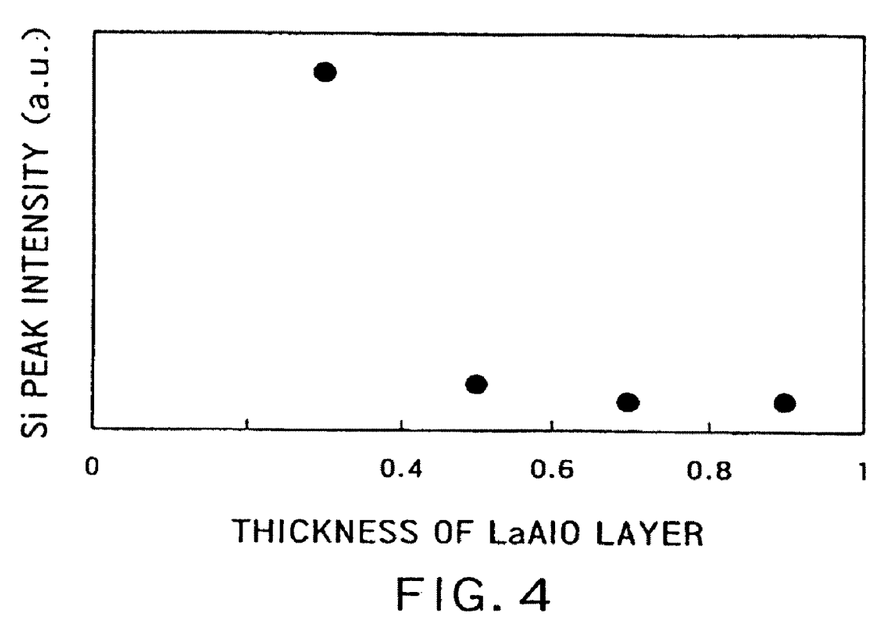
FIG. 4 shows a result of evaluation of the peak intensity of silicon accumulated to the surface of the LaAlO layer by using the X-ray photoelectron spectroscopy.

In order to evaluate the film thickness suitable to bring about the barrier property of the LaAlO layer against the silicon diffusion, the thickness of the LaAlO layer is changed from 0.3 nm to 0.5 nm, 0.7 nm and 0.9 nm, and RTA processing is performed at 1,000° C. for 30 seconds. FIG. 4 shows a result of evaluation of the peak intensity of silicon diffused to the surface obtained from the X-ray photoelectron spectroscopy measurements.

As apparent from FIG. 4, the Si peak intensity becomes remarkably small if the film thickness exceeds 0.5 nm, and it is hardly detected when the film thickness is 0.5 nm and more. In other words, a film thickness of 0.5 nm and more is desirable to obtain a sufficient barrier property of the LaAlO layer against the silicon diffusion.

Figure 5:
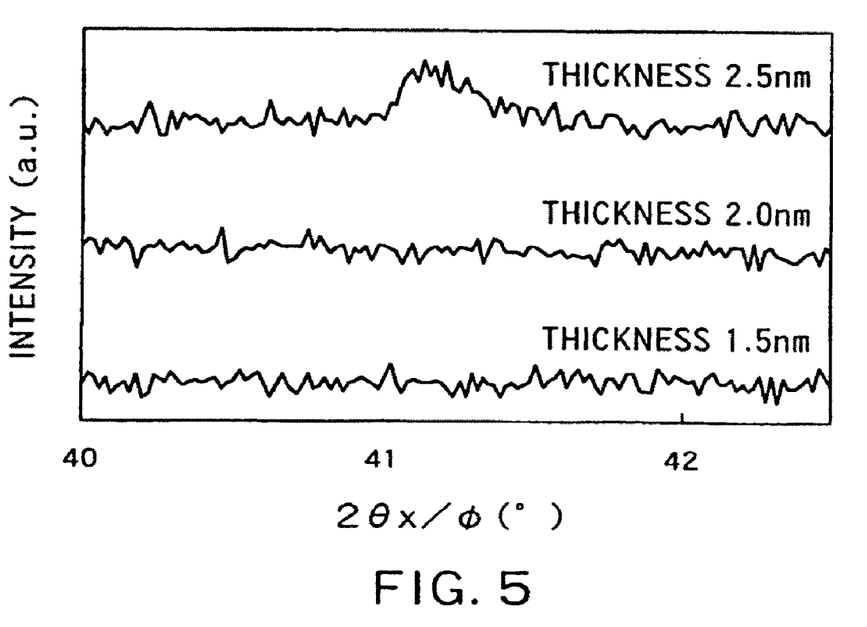
FIG. 5 shows a result obtained from in-plane X-ray diffraction measurements to the LaAlO layer.

In order to evaluate the heat resistance of the LaAlO layer (amorphous layer) against crystallization, the film thickness of LaAlO is changed from 1.5 nm, 2.0 nm and 2.5 nm, and RTA processing is performed at 1,000° C. for 30 seconds. FIG. 5 shows a result obtained from in-plane X-ray diffraction measurements while paying attention to the $LaAlO_3$ (600) peak.

In FIG. 5, the diffraction peak of $LaAlO_3$ (600) is not observed at a film thickness of 1.5 nm and 2.0 nm, whereas an extremely weak peak is observed at a film thickness of 2.5 nm.

This indicates that LaAlO is not crystallized at a film thickness of 2.0 nm or less even if the RTA processing is conducted at 1,000° C. for 30 seconds, whereas crystallization is induced at a film thickness of 2.5 nm by going through the same process. Crystallization of the gate insulation layer is a phenomenon to be suppressed. Because its grain boundary becomes a diffusion path for impurities, such as boron or arsenic, introduced to activate polycrystalline silicon gate electrode, and these impurities diffuse to the channel, and consequently a threshold voltage shift might be brought about or the grain boundary might form a trap level. Taking this into consideration, it is desirable to use a LaAlO layer serving as a barrier layer for the gate insulation layer and having a thickness of 2 nm or less in which crystallization is not induced even if RTA processing is applied at 1,000° C. for 30 seconds.

If two factors, i.e., the barrier property to the silicon diffusion and heat resistance to crystallization are taken into consideration, it is desirable that the LaAlO barrier layer is an amorphous layer having a thickness in the range of 0.5 nm to 2 nm.

The phenomenon that silicon atoms in the silicon substrate is diffused and accumulated to the surface of the insulation layer as observed in FIG. 3B is observed in the same way also in the case where an oxide of Zr, Ti or Ta is used as a high dielectric constant insulation layer. In other words, if these insulation layers are used simply as the gate insulation layer, there is a fear that a silicon oxide might be formed at the interface between the silicon substrate and the insulation layer or the silicon oxide and silicide might be formed at the interface between the insulation layer and the electrode, and a resultant low dielectric constant interface layer might shift the threshold voltage. In these insulation layers as well, however, the reaction between the silicon substrate and the insulation layer component and diffusion of silicon in the insulation layer are suppressed using LaAlO barrier layer. In its turn, it is possible to suppress formation of the low dielectric constant interface layer and the threshold shift.

Since the oxides of Hf, Zr, Ti or Ta have high dielectric constant and excellent in heat resistance, it degrades little even after a high temperature process and consequently it is suitable for an insulation layer of a semiconductor device such as a gate insulation layer of a MISFET. On the other hand, not only a metal oxide containing La and Al has a property suitable for a barrier material as described above, but also the dielectric constant of the metal oxide itself is high. Therefore, the metal oxide containing La and Al is very suitable for use as a thin film barrier material at the silicon interface in the high dielectric constant gate insulation layer. Accordingly, it is possible to obtain a semiconductor device having high reliability by stacking them.

As the LaAlO layer, specifically, a composite oxide, for example, containing La and Al represented as $LaAlO_3$ is used. Alternatively, a material that is not apt to generate a low dielectric constant layer at an interface to the substrate or the electrode, such as $La_2O_3$ or $Al_2O_3$ may be partially contained.

In the above-described example, a series of film is deposited by using Pulsed Laser Deposition method. However, the deposition method of the film is not restricted to this method, but a method such as the CVD method, MBE method, evaporation method or ALD method may also be used.

Furthermore, in the above described example, the LaAlO layer is an amorphous layer. On a silicon substrate, mismatch between the silicon and $LaAlO_3$ is as small as 1.1%. Therefore, the $LaAlO_3$ crystal layer or $LaAlO_3$ actively formed on the silicon substrate can make epitaxial growth. More desirably, therefore, an epitaxial single crystal layer of $LaAlO_3$ which is not apt to generate grain boundaries may be used. Since this $LaAlO_3$ crystal has a perovskite structure and a very high density, it exhibits an effect as the barrier material as well.

The semiconductor device according to the present invention can be applied to a gate insulation layer and a gate electrode structure in a MISFET, a gate electrode and an insulation layer structure of a nonvolatile memory device, and an electrode and an insulation layer structure of a capacitor in a capacitive device. However, the semiconductor device according to the present invention is not restricted to them.

Figure 6:
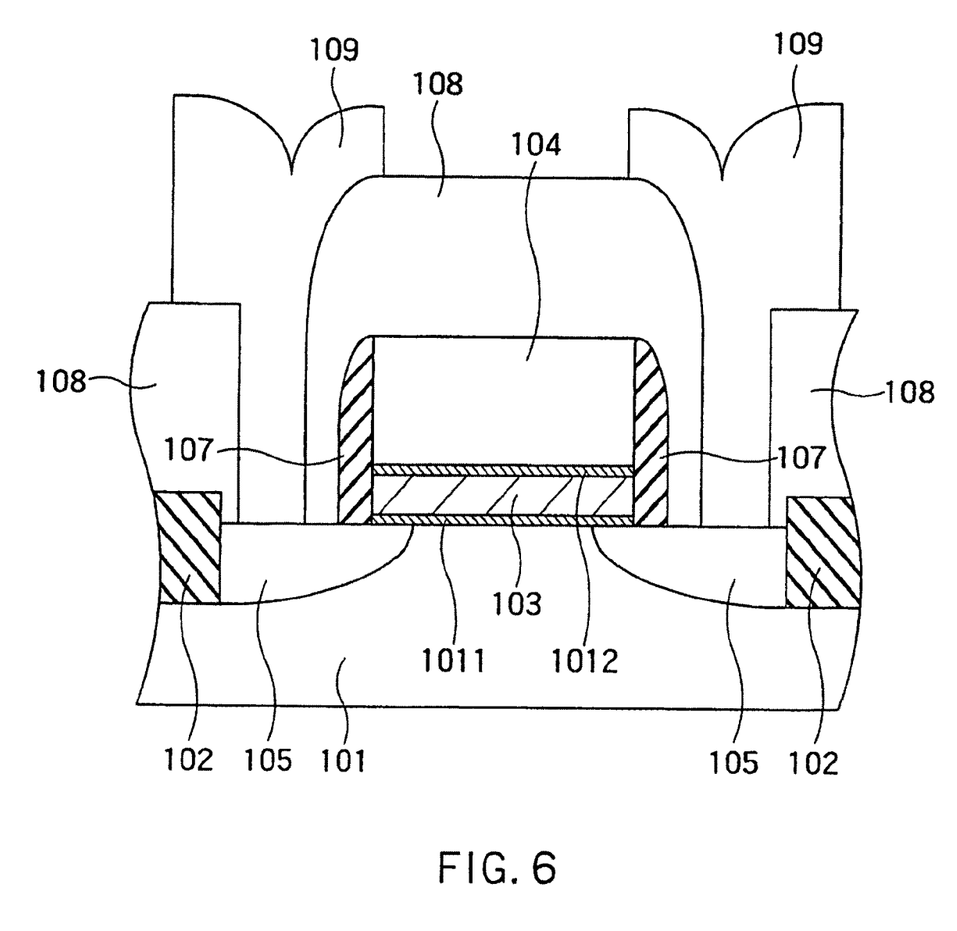
FIG. 6 shows a sectional view of an embodiment of a MISFET.

FIG. 6 is a sectional view showing an embodiment of a semiconductor device having a MISFET. Device isolation layers 102 each including a silicon oxide layer are formed on a surface of an n-type silicon substrate 101. Source/drain diffusion layers 105 are formed in a device region defined by the device isolation layer 102. A gate insulation layer 103 having a thickness in the range of approximately 2 nm to 5 nm and a gate electrode 104 which is a polysilicon layer provided on the gate insulation layer 103 are formed on the n-type silicon substrate 101 between source/drain diffusion layers 105.

A substrate—gate insulation layer interface barrier layer 1011 having a thickness in the range of approximately 0.5 nm to 2 nm is formed at the interface between the gate insulation layer 103 and the silicon substrate 101. A gate insulation layer—gate electrode interface barrier layer 1012 having a thickness in the range of approximately 0.5 nm to 2 nm is formed at the interface between the gate insulation layer 103 and the gate electrode 104. A metal oxide layer containing La and Al according to the present invention is applied to the interface. barrier layers 1011 and 1012.

Gate side walls 107 of a silicon nitride layer are formed on side walls of the stuck of the interface barrier layer 1011, the gate insulation layer 103, the gate electrode 104 and the: interface barrier layer 1012. In this way, a MISFET including the gate electrode 104 and the source/drain diffusion layers 105 is constructed.

Interlayer insulation layers 108 each formed of a silicon oxide layer are formed on the n-type silicon substrate 101 having such a MISFET formed thereon. A contact hole arriving at the source/drain diffusion layer 105 is formed through each interlayer insulation layer 108. Metal wiring 109 of aluminum electrically connected to the source/drain diffusion layer 105 is embedded in the contact hole.

The example in which the interface barrier layer 1011 and the interface barrier layer 1012 are provided respectively at the upper and lower interfaces of the gate insulation layer 103 is shown in FIG. 6. Even if at least one of the interface barrier layer 1011 and the interface barrier layer 1012 is present, however, the effects of the present invention are brought about. It is desirable that at least the substrate—gate insulation layer interface barrier layer 1011 is provided. It is more desirable to enhance the effects of the present invention that both the interface barrier layers 1011 and 1012 are provided.

As the gate insulation layer 103, a gate insulation layer formed of HfO, $HfO_2$, $HfSiO_4$, HfSiON, $ZrO_2$, $ZrSiO_4$, $TiO_2$, $TaO_5$, $Ta_2O_5$, $Sr_2Ta_2O_7$, $SrTiO_3$, $BaTiO_3$, $CaTiO_3$, $Ba_xSr_{1-x}TiO_3$, $PbTiO_3$, $PbZr_xTi_{1-x}O_3$, $SrBi_2Ta_2O_9$, $SrBi_2(Ta_xNb_{1-x})_2O_9$, $CeO_2$, HfAlO, HfAlON, or $Bi_2(Ta_xNb_{1-x})O_6$ can be mentioned.

As the gate electrode 104, a metal gate electrode such as polycrystalline SiGe, TiN, Mo, Au, Al, Pt, Ag or W may also be used.

An embodiment of a manufacturing method of the semiconductor device having the MISFET shown in FIG. 6 will now be described with reference to FIGS. 7A to 8C. FIGS. 7A to 8C are schematic sectional views showing an embodiment of a manufacturing process of the MISFET.

A fabrication method will now be described by using a MISFET in which a LaAlO layer is applied to the upper and lower interface barrier layers of the $HfO_2$ gate insulation layer, as an example.

Figure 7A:
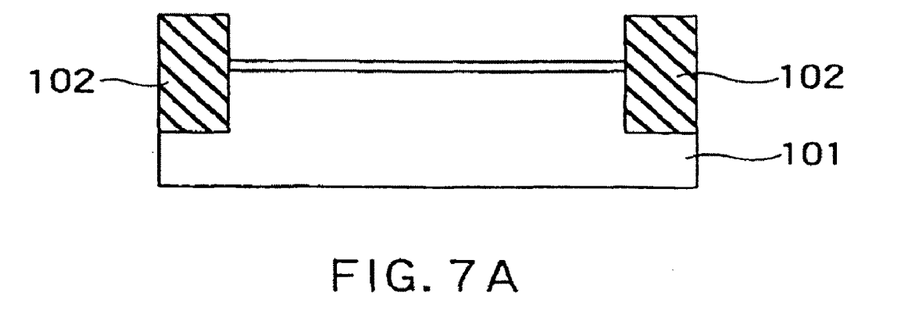
FIGS. 7A to 7C show an embodiment of a manufacturing method of the MISFET.

First, as shown in FIG. 7A, the device isolation regions 102 each formed of a silicon thermal oxidation film are formed on the p-type silicon substrate 101. In FIG. 7A, the device isolation regions 102 project above the substrate surface. However, the top surfaces of the device isolation regions 102 may have the same height as the substrate surface.

Figure 7B:
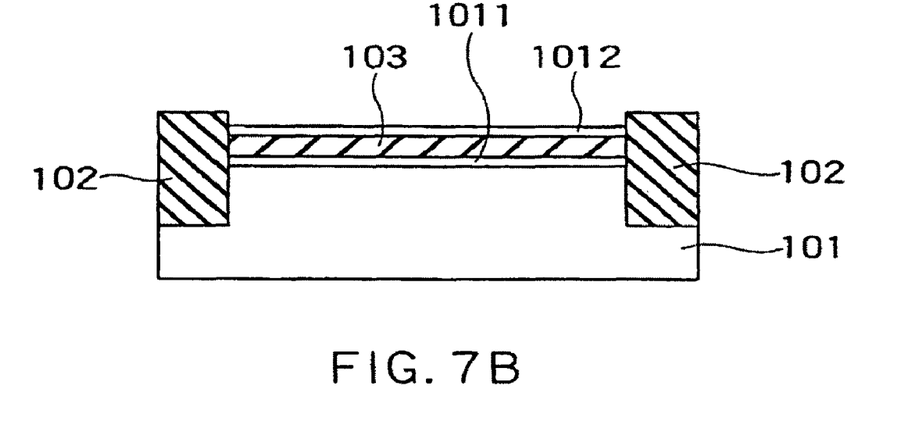

Subsequently, as shown in FIG. 7B, a metal oxide forming process (A) for forming the LaAlO layer having a thickness of 1.5 nm serving as the barrier layer 1011 on the silicon substrate surface, an insulation layer process for forming the $HfO_2$ layer having a thickness of 2 nm serving as the gate insulation layer, and a metal oxide forming process (B) for forming the LaAlO layer having a thickness of 1.5 nm serving as the barrier layer 1012 are executed. Details of the metal oxide forming processes (A) and (B) will be described later. According to the desired forming position of the barrier layer, one or both of the metal oxide forming processes (A) and (B) may be executed.

Figure 7C:
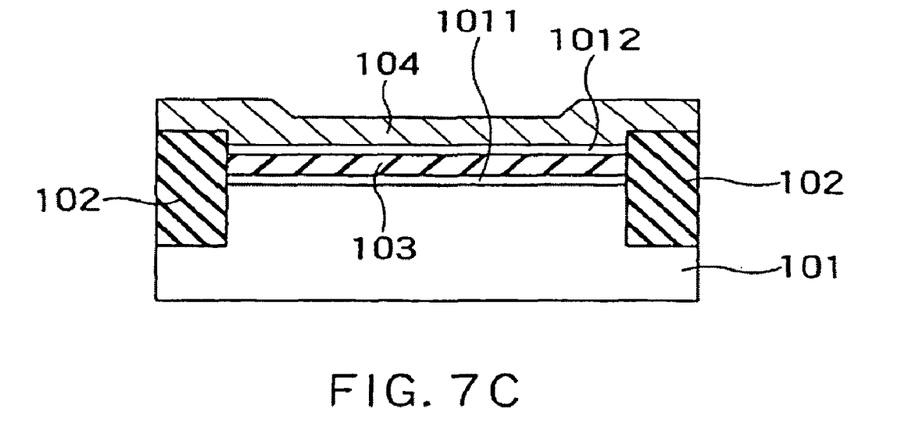
Figure 8A:
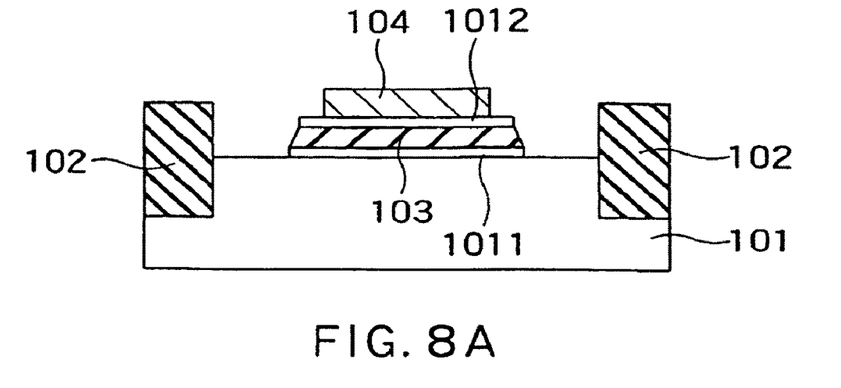
FIGS. 8A to 8C show the embodiment of the manufacturing method of the MISFET.

Subsequently, as shown in FIG. 7C, a polysilicon film 104 is deposited on the whole surface by using the chemical vapor deposition method. Subsequently, as shown in FIG. 8A, an electrode forming process is executed to pattern the polysilicon film and form the gate electrode 104.

Figure 8B:
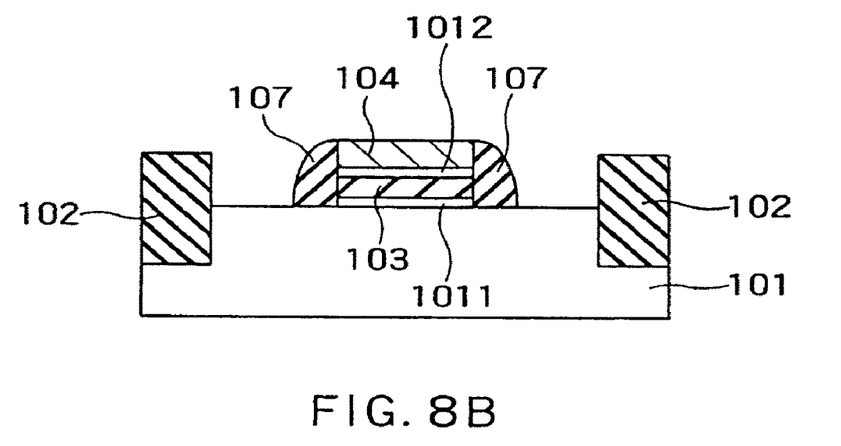

Subsequently, as shown in FIG. 8B, side wall insulation films 107 each formed of, for example, a silicon nitride film are formed on side walls of the gate portion.

Figure 8C:
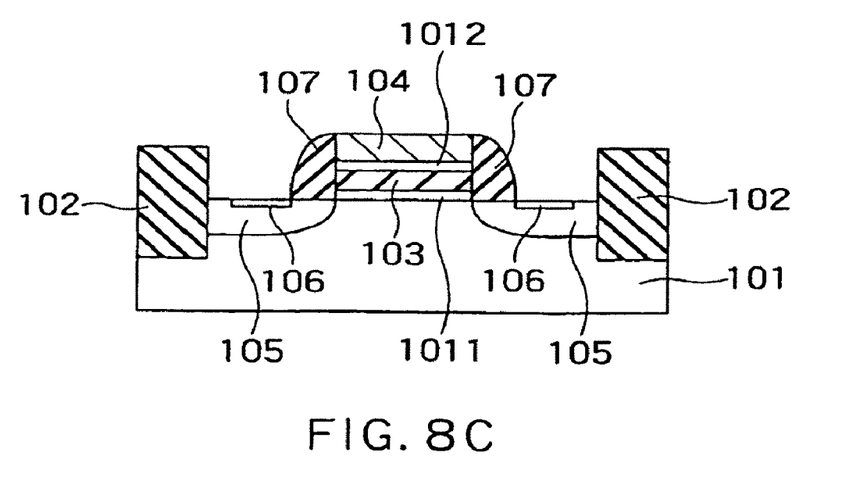

Subsequently, as shown in FIG. 8C, ion implantation of, for example, P is conducted on the whole surface. Thereafter, heat treatment is conducted to diffuse P in the silicon substrate 101 and activate P, and source/drain regions 105 are formed.

Subsequent processes are similar to the fabrication processes of an ordinary MIS transistor. The silicon oxide film serving as the interlayer insulation film is deposited on the whole surface by using the chemical vapor deposition method. The contact hole is formed through the interlayer insulation film 108. Subsequently, an Al film is deposited on the whole surface by using the sputter method. The Al film is patterned by using the reactive ion etching to form the aluminum wiring 109. As a result, the MIS transistor having the structure as shown in FIG. 6 is completed.

Even if the MISFET thus formed is subjected to a high temperature process of approximately 1,000° C. and more, the leakage current in the gate insulation layer is suppressed to an extremely low value and the threshold voltage shift is not observed, resulting in a favorable operation.

Hereafter, the metal oxide forming processes (A) and (B) will be described in more detail.

In an example of a metal oxide forming process that can be applied to the metal oxide forming processes (A) and (B), an oxide containing La and Al is formed on the silicon substrate surface and/or the insulation film surface by using Pulsed Laser Deposition method, CVD method, MBE method, evaporation method, ALD method or the like.

In another example of a metal oxide forming process that can be applied to the metal oxide forming processes (A) and (B), a metal layer having metal La and metal Al deposited so as to have a thickness one mono layer or less is formed, and then an oxide layer containing La and Al is deposited on the metal layer in oxygen atmosphere and the metal layer is oxidized. For this process, for example, Molecular Beam Epitaxy method (MBE method) can be applied. Hereafter, its specific example will be described.

First, an n-type silicon substrate with native oxide layer removed by the dilute HF solution is introduced into an MBE chamber. The substrate temperature is set equal to 300° C. By using metal La and metal Al as an evaporation source, La and Al are evaporated on the silicon substrate by one mono layer at a composition ratio of 1:1. Thereafter, the substrate temperature is raised to 600° C. While introducing oxygen of $1 \times 10^{-4}$ Pa into an MBE apparatus, a LaAlO layer having a thickness of 1 nm is deposited by using metal La and metal Al as an evaporation source.

The XPS spectrum of the layer thus deposited is similar to that shown in FIGS. 2A to 2C. A peak of Si oxide state and a peak of each of La metal and Al metal caused are not observed. As for Si, only a peak of the substrate is observed. As for each of La and Al, only a peak caused by the oxide is observed. This result indicates that La and Al deposited first by one mono layer are fully oxidized in the subsequent processes and the LaAlO layer is present directly on the silicon substrate without having any transition layer at the interface. Furthermore, the barrier layer fabricated by such a method exhibits a favorable barrier property against silicon diffusion in the same way as FIG. 3B. The formations of the silicide and a low dielectric constant interface layer are prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device manufacturing method comprising:
    forming a single layer of $LaAlO_3$, which has a uniform concentration in a depth direction, directly on a surface of a silicon substrate;
    forming an insulation layer on the $LaAlO_3$ layer, the insulation layer containing an oxide of an element of at least one kind selected from Hf, Zr, Ti, and Ta;
    forming an electrode above the insulation layer; and
    annealing the silicon substrate, the $LaAlO_3$ layer functioning as a barrier preventing silicon diffusion during the annealing,
    wherein the device is a MISFET.

2. The semiconductor device manufacturing method according to claim 1, wherein
    the $LaAlO_3$ layer is an amorphous layer.

3. The semiconductor device manufacturing method according to claim 1, wherein
    the $LaAlO_3$ layer has a thickness in the range of 0.5 nm to 2 nm.

4. The semiconductor device manufacturing method according to claim 1, wherein
    the silicon substrate is annealed at 1000° C. or more.

5. A semiconductor device manufacturing method comprising:
    forming an insulation layer on a silicon substrate, the insulation layer containing an oxide of an element of at least one kind selected from Hf, Zr, Ti, and Ta;
    forming a single layer of $LaAlO_3$, which has a uniform concentration in a depth direction, directly on a top surface of the insulation layer;
    forming an electrode above the $LaAlO_3$ layer; and annealing the silicon substrate, the LaAlO₃ layer functioning as a barrier preventing silicon diffusion during the annealing,
wherein the device is a MISFET.

6. The semiconductor device manufacturing method according to claim 5, wherein
the LaAlO₃ layer is an amorphous layer.

7. The semiconductor device manufacturing method according to claim 5, wherein
the LaAlO₃ layer has a thickness in the range of 0.5 nm to 2 nm.

8. The semiconductor device manufacturing method according to claim 5, wherein
the silicon substrate is annealed at 1000° C. or more.

9. A semiconductor device manufacturing method comprising;
forming an insulation layer on a silicon substrate, the insulation layer containing an oxide of an element of at least one kind selected from Hf, Zr, Ti, and Ta;
forming an electrode above the insulation layer; and
forming a metal oxide by using at least one of the following metal oxide forming processes,
forming a first metal layer having metal La and metal Al deposited so as to have a thickness of one atom layer or less on a surface of the silicon substrate, and then depositing a first metal oxide layer containing La and Al on the metal layer in oxygen atmosphere and oxidizing the first metal layer to form a single layer of LaAlO₃, which has a uniform concentration in a depth direction, directly on the silicon substrate, before forming the insulation layer; and
forming a second metal layer having metal La and metal Al deposited so as to have a thickness of one atom layer or less on a surface of the insulation layer, and then depositing a second metal oxide layer containing La and Al on the second metal layer in oxygen atmosphere and oxidizing the second metal layer to form LaAlO₃ layer, after forming the insulation layer before forming the electrode,
wherein the device is a MISFET.

10. The semiconductor device manufacturing method according to claim 9, wherein
the first metal oxide layer or the second metal oxide layer is an amorphous layer.

11. The semiconductor device manufacturing method according to claim 9, wherein
the first metal oxide layer or the second metal oxide layer has a thickness in the range of 0.5 nm to 2 nm.

* * * * *